(12) United States Patent
Aoki et al.

(10) Patent No.: US 6,177,837 B1
(45) Date of Patent: Jan. 23, 2001

(54) ACTIVE LOW-PASS FILTER

(75) Inventors: Kazuharu Aoki; Shoichi Asano, both of Fukushima-ken (JP)

(73) Assignee: Alps Electric Co., Ltd., Tokyo (JP)

(*) Notice: Under 35 U.S.C. 154(b), the term of this patent shall be extended for 0 days.

(21) Appl. No.: 09/320,260

(22) Filed: May 26, 1999

(30) Foreign Application Priority Data

May 27, 1998 (JP) .................................. 10-145752

(51) Int. Cl.[7] .................................................. H03F 1/22
(52) U.S. Cl. ............................ 330/98; 330/303; 330/311
(58) Field of Search ............................... 330/98, 99, 100, 330/110, 302, 303, 306, 310, 311

(56) References Cited

U.S. PATENT DOCUMENTS

| | | | |
|---|---|---|---|
| 3,707,685 | * | 12/1972 | Geffe ................................... 330/99 X |
| 4,363,004 | * | 12/1982 | Englund et al. ................. 330/303 X |
| 5,764,100 | * | 6/1998 | Callicotte et al. ............... 330/311 X |

FOREIGN PATENT DOCUMENTS 8-172340   7/1996   (JP) .

OTHER PUBLICATIONS

Rodwell et al., "33 Ghz Monolithic Cascode AlInA3/GaInAs Heterojunction Bipolar Feedback Amplifier", IEEE J.S.S. Circuits vol. 26, issue 10, Oct. 1991 pp. 1378–1382.*

* cited by examiner

*Primary Examiner*—Steven J. Mottola
(74) *Attorney, Agent, or Firm*—Brinks Hofer Gilson & Lione

(57) ABSTRACT

A feedback circuit is connected between the input electrode of amplifying element of an amplifying circuit of the initial stage and the output electrode of amplifying element of an amplifying circuit of the final stage. The feedback circuit is structured by a serial circuit of a voltage dropping means resulting in almost constant voltage drop regardless of an increase or decrease of current and a feedback resistor, and a bias voltage is supplied, via the feedback circuit, to an input electrode of the amplifying element in the amplifying circuit of the initial stage from an output electrode of the amplifying element in the amplifying circuit of the final stage. Thereby, current dissipation is reduced and signal loss is lowered.

6 Claims, 1 Drawing Sheet

ACTIVE LOW-PASS FILTER

BACKGROUND OF THE INVENTION

1. Field of the Invention

The present invention relates to an active low-pass filter which consumes less current and assures excellent distortion characteristic.

2. Description of the Related Art

FIG. 3 is a circuit diagram illustrating an active low-pass filter of the related art. As illustrated in FIG. 3, the active low-pass filter of the related art comprises of a common-emitter amplifying circuit 31 of the first stage and a common-base amplifying circuits 32, 33 of the second and third stages, where a feedback resistor 34 is connected, as a negative feedback circuit, between an output end of the common-base amplifying circuit 33 of the third stage as the common-base amplifying circuit of the final stage and an input end of the common-emitter amplifying circuit 31 of the first stage, a first capacitor 35 for setting the cutoff frequency is connected between the connecting point of the common-emitter amplifying circuit 31 and common-base amplifying circuit 32 and the ground, and a second capacitor 36 for setting the cut-off frequency is also connected between the connecting point of the common-base amplifying circuit 32 of the next stage and the common-base amplifying circuit 33 of the third stage and the ground.

The collector of transistor Q1 and emitter of transistor Q2 are DC-connected via a resistor 37 so that a common collector current flows into the transistors Q1, Q2, Q3 of each amplifying circuit 31, 32, 33 and the collector of transistor Q2 and the emitter of transistor Q3 are also DC-connected via a resistor 38. Resistors 37, 38 are provided to reduce distortion generated in the common-base amplifying circuits 32, 33 having a low input impedance.

The power supply voltage is applied, via a load resistor 39, to the collector of transistor Q3 as the output end of the common-base amplifying circuit 33, while the emitter of transistor Q1 of the common-emitter amplifying circuit 31 is grounded through a resistor 40.

The feedback resistor 34 sets amount of feedback current and also gives abias voltage to the base of transistor Q1 of the common-emitter amplifying circuit 31 of the initial stage. Therefore, this feedback resistor 34 is connected between the base of transistor Q1 as the input end of the common-emitter amplifying circuit 31 of the initial stage and the collector of transistor Q3 of the common-base amplifying circuit 33 of the final stage and a bias resistor 41 is also provided between the base of transistor Q1 and the ground. Thereby, a bias voltage is applied to the base of transistor Q1. Moreover, the bias voltage is also applied to the bases of transistors Q2, Q3 through the bias resistors 42, 43, 44.

In the structure explained above, a high frequency signal input from a signal input terminal 45 is amplified by the common-emitter amplifying circuit 31 through a coupling capacitor 46 and the high frequency element of this signal is cut by the first capacitor 35. The high frequency signal is further amplified by the common-base amplifying circuit 32 through a resistor 37 and the high frequency element of this signal is then cut by the second capacitor 36 and is then input to the common-base amplifying circuit 33 of the final stage. The high frequency signal amplified by the common-base amplifying circuit 33 of the final stage is output from a signal output terminal 49 through a capacitor 47, for impedance matching, and a coupling capacitor 48.

In the active low-pass filter of the related art explained above, since a bias voltage is supplied to the base of the transistor in the common-emitter amplifying circuit of the initial stage through a feedback resistor connected to the collector of the transistor in the common-base amplifying circuit of the final stage and to the base of the transistor in the common-emitter amplifying circuit of the initial stage, a current flowing through the feedback resistor has been wasted. Moreover, since abias voltage is applied to the base of the transistor in the common-emitter amplifying circuit of the initial stage, a resistor is provided between the base and the ground, thereby resulting in loss of input signal.

SUMMARY OF THE INVENTION

It is therefore an object of the active low-pass filter of the present invention to reduce the amount of current dissipation and loss of signal.

In order to solve the problem explained above, the active low-pass filter of the present invention is provided with cascade-connected amplifying circuits of a plurality of stages respectively having the amplifying elements and capacitor for setting cut-off frequency connected between the connecting point of amplifying circuits explained above and the ground. Each amplifying element has an input electrode and an output electrode, and a feedback circuit is connected between the input electrode of the amplifying element in the amplifying circuit of the initial stage and an output electrode of the amplifying element in the amplifying circuit in the final stage. The feedback comprises of a serial circuit of a voltage dropping means which results in almost constant voltage drop regardless of an increase or decrease of current, and a feedback resistor. A bias voltage is supplied to the input electrode of the amplifying element in the amplifying circuit of the initial stage from an output electrode of the amplifying element in the amplifying circuit of the final stage via the feedback circuit.

Moreover, the active low-pass filter of the present invention uses a diode as the voltage dropping means and connects the anode of the diode to the amplifying circuit side in the final stage and the cathode of diode to the amplifying circuit side in the initial stage.

In addition, the active low-pass filter of the present invention uses a transistor as the voltage dropping means and connects the base of the transistor to an output electrode of the amplifying element of the amplifying circuit in the final stage and the emitter of the transistor to the feedback resistor and supplies the power supply voltage to the collector of transistor.

Moreover, the active low-pass filter of the present invention is provided with a constant current source between the input electrode of the amplifying element of the amplifying circuit in the initial stage and the ground.

DETAILED DESCRIPTION OF THE PREFERRED EMBODIMENT

Figure 1:
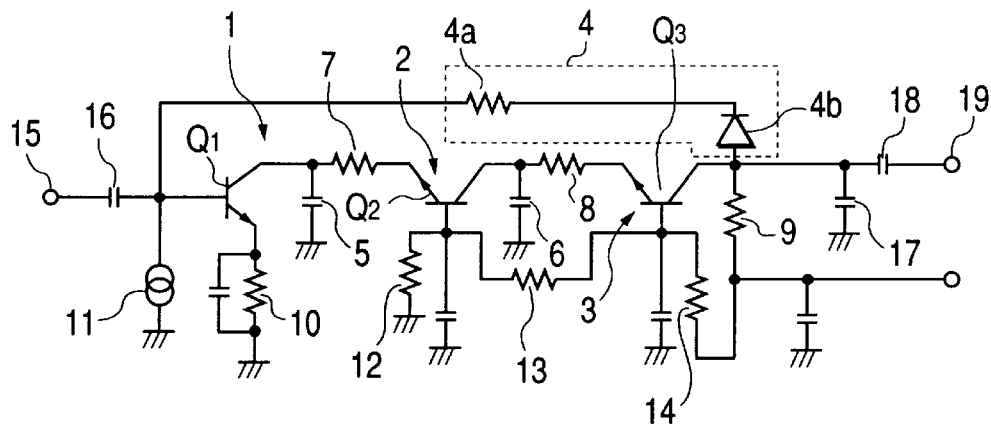
FIG. 1 is a circuit diagram illustrating an active low-pass filter of the present invention.
Figure 2:
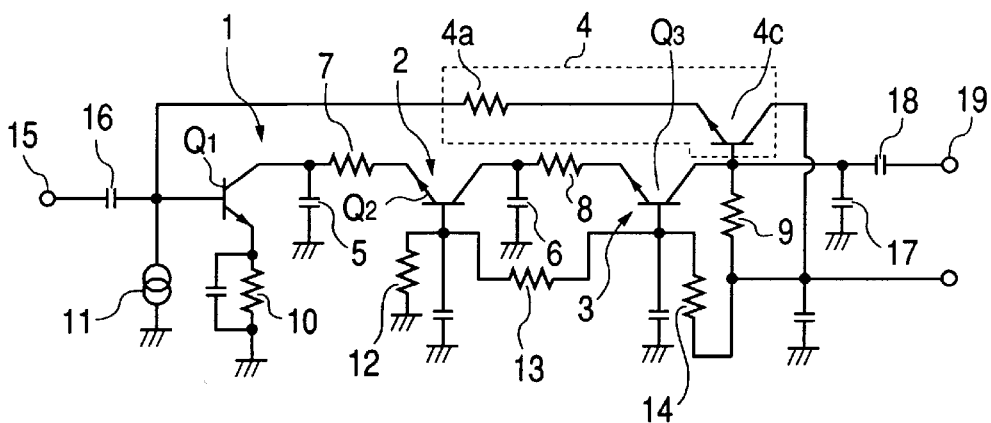
FIG. 2 is a circuit diagram illustrating an active low-pass filter of the present invention.
Figure 3:
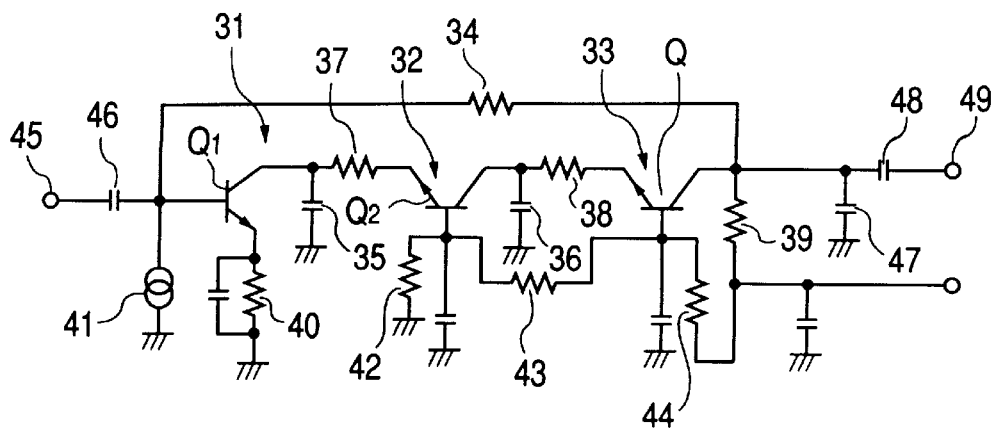
FIG. 3 is a circuit diagram illustrating an active low-pass filter of the related art.

FIG. 1 and FIG. 2 are circuit diagrams illustrating the active low-pass filters of the present invention. First, the active low-pass filter of the present invention comprises, as shown in FIG. 1, of a common-emitter amplifying circuit 1 of the initial stage and the common-base amplifying circuits 2, 3 of the second and third stages, wherein a feedback circuit 4 is connected between the output end of the common-base amplifying circuit 3 of the third stage, as the common-base amplifying circuit of the final stage, and the input end of the common-emitter amplifying circuit 1 of the initial stage. The first capacitor 5 for setting the cut-off frequency is connected between the connecting point of the common-emitter amplifying circuit 1 and the common-base amplifying circuit 2 and the ground, and the second capacitor 6 for setting the cut-off frequency is also connected between the connecting point of the common-base amplifying circuit 2 of the second stage and the common-base amplifying circuit 3 of the third stage and the ground.

The collector of the transistor Q1 is DC-connected via the resistor 7 to the emitter of the transistor Q2, and the collector of the transistor Q2 is also DC-connected via the resistor 8 to the emitter of the transistor Q3, so that a common collector current flows to the amplifying transistors Q1, Q2, Q3 of the amplifying circuits 1, 2, 3. Resistors 7 and 8 are provided to reduce the distortion generated by the common-base amplifying circuits 2, 3 having a low input impedance.

Moreover, a power supply voltage is supplied through the load resistor 9 to the collector of the transistor Q3 which is the output end of the common-base amplifying circuit 3, and the emitter of the transistor Q1 of the common-emitter amplifying circuit 1 is grounded through an emitter bias resistor 10.

The feedback circuit 4 sets the amount of feedback current and also gives a bias voltage to the base electrode of the transistor Q1 in the common-emitter amplifying circuit 1 of the initial stage. This feedback circuit is therefore structured by connecting serially the feedback resistor 4a and diode 4b. In this structure, one end of the feedback resistor 4a is connected to the base of the transistor Q1 which is the input end of the common-emitter amplifying circuit 1 of the initial stage, and the diode 4b is connected to the collector of the transistor Q3 of the common-base amplifying circuit 3 in the final stage. In addition, a constant current source 11 is also provided between the base of the transistor Q1 and the ground. Thereby, a current flows into the diode 4b and feedback resistor 4a from the load resistor 9 and a bias voltage is applied to the base of the transistor Q1. Moreover, a bias voltage is also applied by the base bias resistors 12, 13, 14 to the bases of the transistors Q2, and Q3.

The diode 4b in the feedback circuit 4 results in almost constant voltage drop regardless of the current flowing through it, thereby the signal amplitude level at the cathode in the connecting point with the resistor 4a becomes almost equal to the signal level at the collector of transistor Q3.

Meanwhile, since the amount of feedback current is set depending on the resistance value of the feedback resistor 4a, when the amount of feedback current is equal, the amount of current flowing through the feedback resistor 4a can be reduced as much as the voltage drop by the diode 4b.

In addition, when a constant current source 11 is provided at the base of the transistor Q1 of the common-emitter amplifying circuit 1 of the initial stage, since the constant current source 11 has an extremely higher impedance, the high frequency signal input to the signal input terminal 15 is never lost in the constant current circuit.

In the above configuration, the high frequency signal input from the signal input terminal 15 passes through the coupling capacitor 16, is amplified by the common-emitter amplifying circuit 1 and is then cut, in the high frequency range, by the first capacitor 5. The high frequency signal further passes through the resistor 7, is amplified by the common-base amplifying circuit 2 in the next stage, is cut, in the high frequency range, by the second capacitor 6, and is then input to the common-base amplifying circuit 3 of the final stage. The high frequency signal amplified by the common-base amplifying circuit 3 of the final stage is output from the signal output terminal 19 through the impedance matching capacitor 17 and the coupling capacitor 18.

The active low-pass filter illustrated in FIG. 2 uses a transistor 4c in place of the diode 4b in the active low-pass filter illustrated in FIG. 1.

That is, the collector of the transistor Q3 is connected to the base of the transistor 4c, the emitter of the transistor 4c is connected to the feedback resistor 4a and the power supply voltage is supplied directly to the collector of the transistor 4c.

As a result, since the current to give a bias voltage to the base of transistor Q1 is not supplied from the load resistor 9 connected to the collector of the transistor Q3 but from the collector of the transistor 4c to which the power supply voltage is supplied, the collector voltage of the transistor Q3 is never lowered and non-saturation range of the transistor Q3 becomes wide. Accordingly, distortion generated in the transistor Q3 is reduced. Meanwhile, the base-to-emitter characteristic of the transistor 4c becomes equivalent to that of the diode 4b illustrated in FIG. 1, resulting in almost constant voltage drop regardless of the collector current (therefore, the emitter current is almost equal). As a result, the amount of current flowing through the feedback resistor 4a can be reduced.

As described, in the active low-pass filter of the present invention, the feedback circuit is connected between the input electrode of amplifying element in the amplifying circuit of the initial stage and the output electrode of amplifying element in the amplifying circuit of the final stage, the feedback circuit is structured by a serial circuit of the voltage dropping means which results in almost constant voltage drop regardless of an increase or decrease of the current and the feedback resistor, and a bias voltage is supplied to the input electrode of the amplifying element in the amplifying circuit of the initial stage from the output electrode of the amplifying element in the amplifying circuit of the final stage. With the configuration explained above, the amount of current flowing into the feedback resistor can be reduced.

Moreover, the active low-pass filter of the present invention can reduce the amount of current only by using a diode because a diode is used as the voltage dropping means, the anode of diode is connected in the amplifying circuit side of the final stage, and the cathode of diode is connected to the amplifying circuit side in the initial stage.

In addition, when a transistor is used as the voltage falling means, the base of this transistor is connected to the output electrode of the amplifying element-of the amplifying circuit in the final stage, the emitter of the transistor is connected to the feedback resistor, and the power supply voltage is supplied to the collector of the transistor, and the current for supplying a bias voltage is applied from the power supply. Therefore, a drop of voltage applied to the amplifying element of the amplifying circuit in the final stage can be reduced and thereby distortion generated in the amplifying element can also be reduced.

In addition, the active low-pass filter of the present invention can reduce loss of input signal by providing a constant current source between the input electrode of the amplifying element of the amplifying circuit in the initial stage and the ground.

What is claimed is:

1. An active low-pass filter comprising:
    cascade-connected amplifying circuits of a plurality of stages, each comprising:
        an amplifying elements; and
        a capacitor for setting cut-off frequency, said capacitor being connected between a connecting point of the amplifying circuits and the ground,
        wherein said amplifying element has an input electrode and an output electrode; and
    a feedback circuit connected between the input electrode of said amplifying element in an initial amplifying circuit and an output electrode of said amplifying element in a final amplifying circuit,
        wherein said feedback circuit comprises of a serial circuit of a voltage dropping means, which results in almost constant voltage drop regardless of an increase or decrease of current and a feedback resistance, and a bias voltage is supplied to the input electrode of the amplifying element in the initial amplifying circuit from an output electrode of the amplifying element in the final amplifying circuit via said feedback circuit.

2. The active low-pass filter according to claim 1, wherein a diode, wherein its anode is connected to said final amplifying circuit side and its cathode is connected, through said feedback resistor, to said initial amplifying circuit side, is provided as said voltage dropping means.

3. The active low-pass filter, according to claim 1, wherein a transistor, wherein its base is connected to the output electrode of the amplifying element in the final amplifying circuit, its emitter is connected to said feedback resistor, and its collector is connected to a power supply, is provided as said voltage dropping means.

4. The active low-pass filter according to claim 1, wherein a constant current source is provided between the input electrode of the amplifying element in the initial amplifying circuit and the ground.

5. The active low-pass filter according to claim 2, wherein a constant current source is provided between the input electrode of the amplifying element in the initial amplifying circuit and the ground.

6. The active low-pass filter according to claim 3, wherein a constant current source is provided between the input electrode of the amplifying element in the initial amplifying circuit and the ground.

* * * * *

UNITED STATES PATENT AND TRADEMARK OFFICE
CERTIFICATE OF CORRECTION

PATENT NO.   : 6,177,837 B1         Page 1 of 1
DATED        : January 23, 2001
INVENTOR(S)  : Kazuharu Aoki et al.

It is certified that error appears in the above-identified patent and that said Letters Patent is hereby corrected as shown below:

<u>Claim 1,</u>
Line 4, change "elements;" to -- element; --.
Line 17, change "current and" to -- current, and --.

<u>Claim 3,</u>
Line 5, change "to a power" to -- to the power --.

Signed and Sealed this

Eighteenth Day of December, 2001

Attest:

JAMES E. ROGAN
*Attesting Officer*   *Director of the United States Patent and Trademark Office*